US010381522B2

(12) United States Patent
Han et al.

(10) Patent No.: US 10,381,522 B2
(45) Date of Patent: Aug. 13, 2019

(54) LIGHT EMITTING DIODE

(71) Applicant: Samsung Display Co., Ltd., Yongin-si, Gyeonggi-do (KR)

(72) Inventors: Sang Hyun Han, Hwaseong-si (KR); Jong Woo Kim, Hwaseong-si (KR); Young Kook Kim, Suwon-si (KR); Seok Hwan Hwang, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/807,297

(22) Filed: Nov. 8, 2017

(65) Prior Publication Data

US 2018/0138373 A1 May 17, 2018

(30) Foreign Application Priority Data

Nov. 14, 2016 (KR) ........................ 10-2016-0151248

(51) Int. Cl.
*H01L 33/48* (2010.01)
*H01L 51/00* (2006.01)
*H01L 51/52* (2006.01)

(52) U.S. Cl.
CPC .............. *H01L 33/48* (2013.01); *H01L 51/00* (2013.01); *H01L 51/006* (2013.01); *H01L 51/5262* (2013.01)

(58) Field of Classification Search
CPC ............... H01L 51/006; H01L 51/0061; H01L 51/0072; H01L 51/0094; H01L 51/0052; H01L 51/0058; H01L 51/5012
See application file for complete search history.

(56) References Cited

U.S. PATENT DOCUMENTS 8,344,370 B2 * 1/2013 Sumida ............... H01L 51/5206 257/40
9,082,735 B1 * 7/2015 Sundararajan ...... H01L 51/5209
9,095,033 B2 7/2015 Naraoka et al.
9,368,731 B2 * 6/2016 Saito .................. H01L 51/0072
9,478,770 B2 * 10/2016 Kim .................... H01L 51/5203
9,496,520 B2 * 11/2016 Kim ....................... C09K 11/06
9,640,773 B2 * 5/2017 Mizuki ................ C07D 333/76
2005/0236974 A1 * 10/2005 Suzuki ................. C07C 13/567 313/504

(Continued)

FOREIGN PATENT DOCUMENTS

JP 2006-156390 A 6/2006
JP 2006-302878 A 11/2006

(Continued)

OTHER PUBLICATIONS

Huang, Organic electroluminescent derivatives containing dibenzothiophene and diarylamine segments, J. Mater. Chem., 2005, 15, 3233-3240 | 3233.*

*Primary Examiner* — Jaehwan Oh
(74) *Attorney, Agent, or Firm* — Innovation Councsel LLP

(57) ABSTRACT

A light emitting diode is presented, including: a first electrode; a second electrode overlapping the first electrode; an emission layer interposed between the first electrode and the second electrode; and a light efficiency improving layer positioned on at least one of the first electrode and the second electrode, wherein at least one of the first electrode and the second electrode may include one surface facing the emission layer and the other surface opposing the one surface and including the other surface on which the light efficiency improving layer is positioned.

19 Claims, 2 Drawing Sheets

(56) References Cited

U.S. PATENT DOCUMENTS

| | | | | |
|---|---|---|---|---|
| 2009/0091253 | A1* | 4/2009 | Yasukawa | C09K 11/06 313/504 |
| 2012/0138918 | A1* | 6/2012 | Naraoka | C09K 11/06 257/40 |
| 2012/0242219 | A1* | 9/2012 | Seo | C07D 409/10 313/504 |
| 2014/0054559 | A1* | 2/2014 | Kim | H01L 51/0094 257/40 |
| 2014/0175395 | A1* | 6/2014 | Kim | H01L 51/006 257/40 |
| 2014/0326961 | A1* | 11/2014 | Han | H01L 51/006 257/40 |
| 2016/0041493 | A1* | 2/2016 | Goden | H01L 27/3246 257/40 |

FOREIGN PATENT DOCUMENTS

| | | | |
|---|---|---|---|
| JP | 2007-103303 | A | 4/2007 |
| JP | 2012-134071 | A | 7/2012 |
| KR | 10-2006-0059068 | A | 6/2006 |
| KR | 10-0700013 | B1 | 3/2007 |
| KR | 10-0883306 | B1 | 2/2009 |
| KR | 10-2011-0061317 | A | 6/2011 |
| KR | 10-2012-0080536 | A | 7/2012 |
| KR | 10-2014-0145370 | A | 12/2014 |
| KR | 10-2015-0004099 | A | 1/2015 |
| KR | 10-2015-0012835 | A | 2/2015 |
| KR | 10-2015-0077178 | A | 7/2015 |
| KR | 10-1620092 | B1 | 5/2016 |
| WO | 2001/39554 | A1 | 5/2001 |
| WO | 2011-043083 | A1 | 4/2011 |

* cited by examiner

LIGHT EMITTING DIODE

CROSS-REFERENCE TO RELATED APPLICATION

This application claims priority to and the benefit of Korean Patent Application No. 10-2016-0151248 filed in the Korean Intellectual Property Office on Nov. 14, 2016, the entire contents of which are incorporated herein by reference.

BACKGROUND (a) Field

The present disclosure relates to a light emitting diode, and more particularly, to a light emitting diode suffering reduced deterioration due to a harmful wavelength.

(b) Description of the Related Art

Recently, display devices including light emitting diodes have become increasingly popular. As more and more people use display devices including light emitting diodes, display devices are used in a wider variety of environments.

An emission layer used in the display device including the light emitting diode is easily damaged by an external environment. This lack of robustness in the light emitting diode may undesirably result in a shortened device lifespan. Therefore, a display device that may be used in various environments without being damaged and that has excellent light efficiency is increasingly desired.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a light emitting diode that may prevent degradation due to a harmful wavelength.

The technical object to be achieved by the present disclosure is not limited to the aforementioned technical object, and other unmentioned technical objects will be obviously understood by those skilled in the art from the description below.

An exemplary embodiment of the present disclosure provides a light emitting diode including: a first electrode; a second electrode overlapping the first electrode; an emission layer interposed between the first electrode and the second electrode; and a light efficiency improving layer positioned on at least one of the first electrode and the second electrode, wherein at least one of the first electrode and the second electrode may include one surface facing the emission layer and the other surface opposing the one surface and including the other surface on which the light efficiency improving layer is positioned, wherein the light efficiency improving layer may have a structure of Chemical Formula 1 below, wherein X may have a structure of C1-Z—C2 in which C1 and C2 are each independently selected from benzene, naphthalene, and anthracene; Z may be one of $CH_2$, CHR, CR1R2, O, and S; R, R1, and R2 may each independently be a substituted or unsubstituted alkyl group having 1 to 5 carbon atoms; C1-Z—C2 may consist of one condensed ring having 4 or 5 carbon atoms; L1 may be a substituted or unsubstituted arylene group having 5 to 8 carbon atoms, or a substituted or unsubstituted heteroarylene group having 4 to 8 carbon atoms as an independent single bond and a divalent linking group; and Ar1 to Ar4 may each independently represent a substituted or unsubstituted arylene group having 6 to 30 carbon atoms, a substituted or unsubstituted heteroarylene group having 3 to 30 carbon atoms, or a substituted or unsubstituted condensed polycyclic group having 6 to 30 carbon atoms.

[Chemical Formula 1]

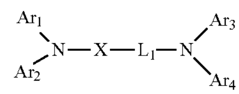

Herein, X may have a structure of one of Chemical Formula 2 to Chemical Formula 4, Z may be one of $CH_2$, CHR, CR1R2, O, and S, and R, R1, and R2 may be the same or different substituted or unsubstituted alkyl group having 1 to 5 carbon atoms.

[Chemical Formula 2]

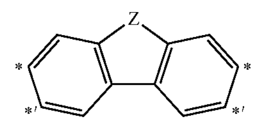

[Chemical Formula 3]

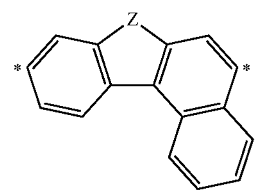

[Chemical Formula 4]

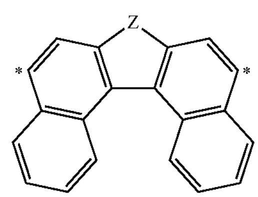

Herein, Z, R1, and R2 may each be $C(CH_3)_2$ corresponding to $CH_3$, wherein * and *' indicate a site that is bound to a neighboring atom.

The light efficiency improving layer may include one of Compound A1 to Compound A5.

[Compound A1]

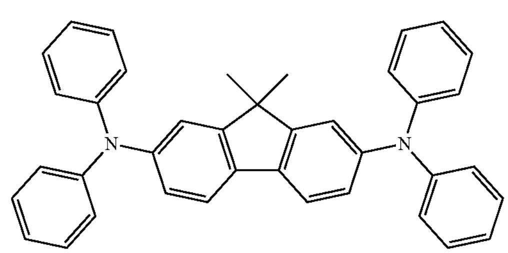

-continued
[Compound A2]
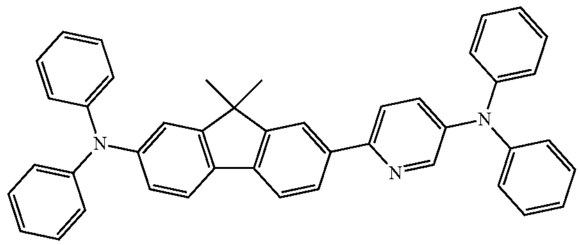
[Compound A3]
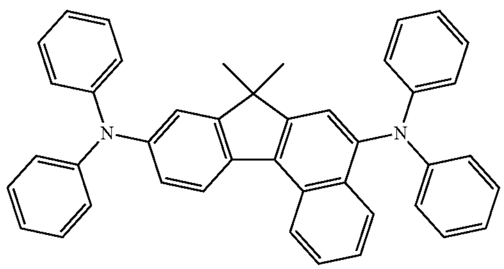
[Compound A4]
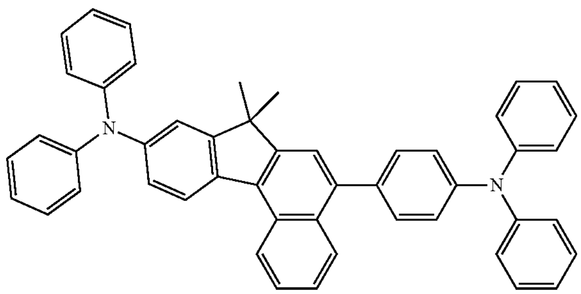
[Compound A5]
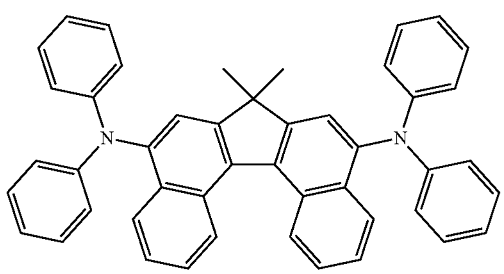
Herein, Z may be O, and the light efficiency improving layer may include one of Compound A6 to Compound A10.
[Compound A6]
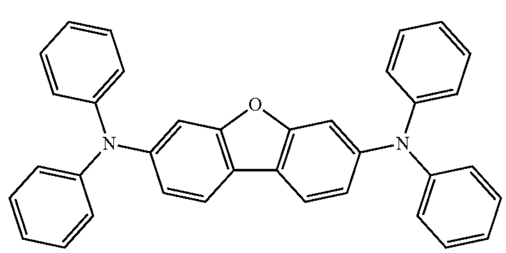
*30
-continued
[Compound A7]
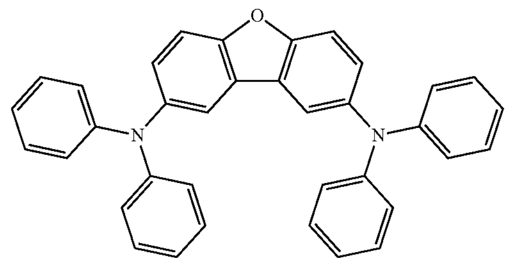
[Compound A8]
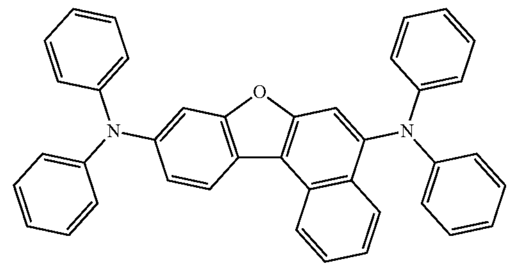
*34
[Compound A9]
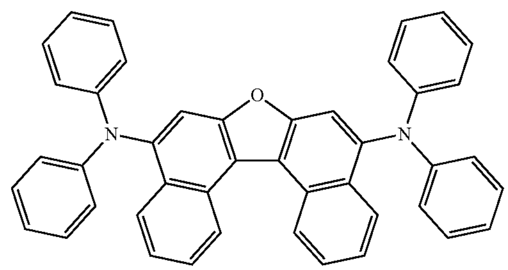
[Compound A10]
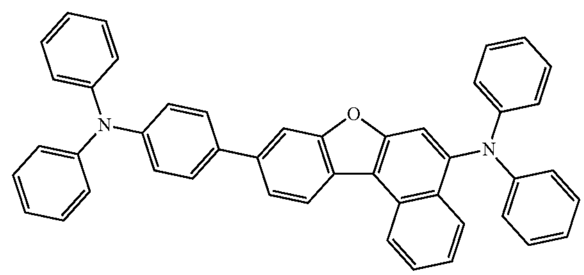
Herein, Z may be S, and the light efficiency improving layer may include one of Compound A11 to Compound A15.
[Compound A11]
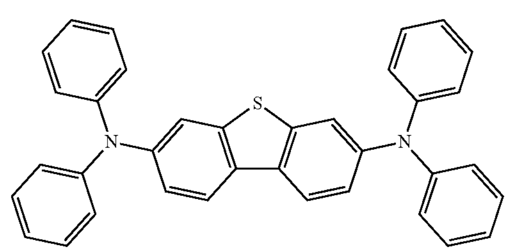

-continued

[Compound A12]

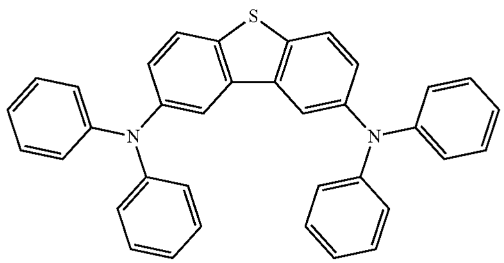

[Compound A13]

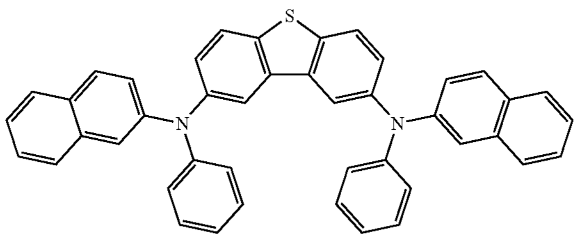

[Compound A14]

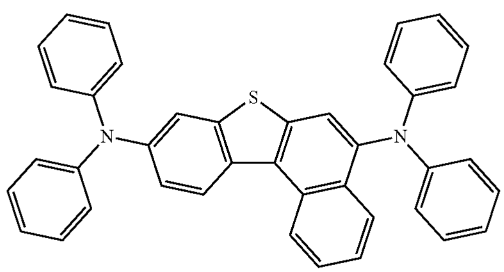

[Compound A15]

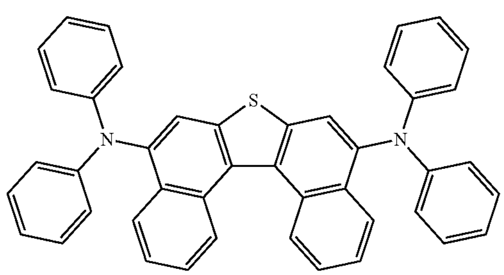

Herein, X may have a structure of Chemical Formula 5, wherein * indicates a site that is bound to a neighboring atom.

[Chemical Formula 5]

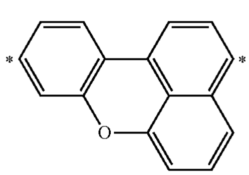

The light efficiency improving layer may include one of Compound A16 to Compound A18.

[Compound A16]

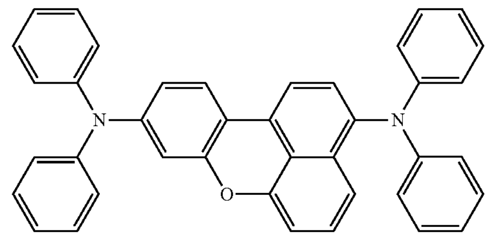

[Compound A17]

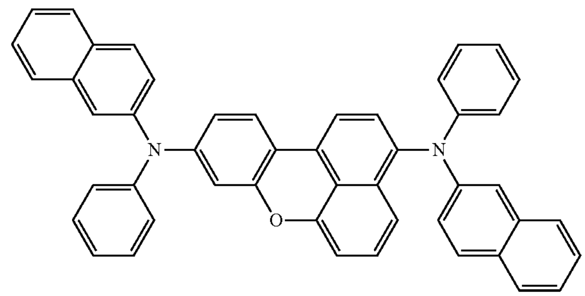

[Compound A18]

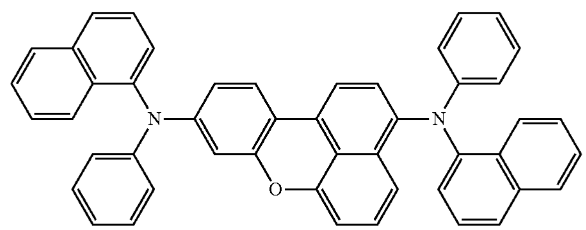

Herein, X may have a structure of Chemical Formula 6, wherein * indicates a site that is bound to a neighboring atom.

[Chemical Formula 6]

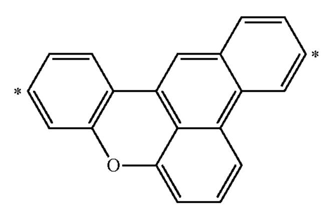

The light efficiency improving layer may include one of Compound A19 and Compound A20.

[Compound A19]

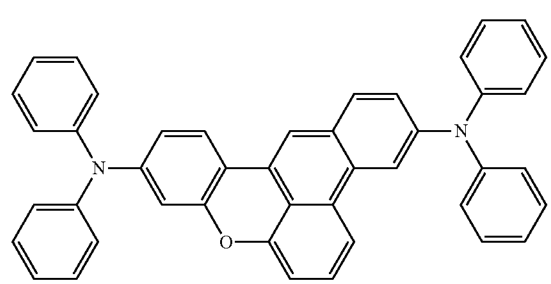

-continued

[Compound A20]

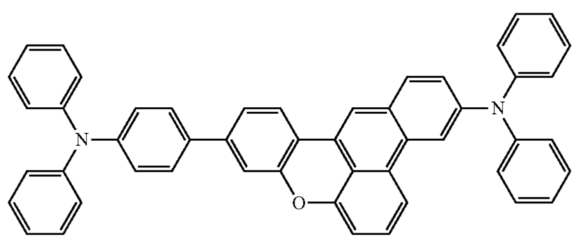

The light efficiency improving layer may have an absorption ratio of 0.30 or more at a wavelength of 400 nm to 410 nm.

The emission layer may be provided with a plurality of layers displaying different colors to emit white light.

The plurality of layers may have a structure in which two or three layers are stacked.

According to the light emitting diode of the embodiment of the present disclosure, it is possible to prevent degradation of an emission layer by blocking light of a harmful wavelength region.

DETAILED DESCRIPTION OF THE EMBODIMENTS

Figure 1:
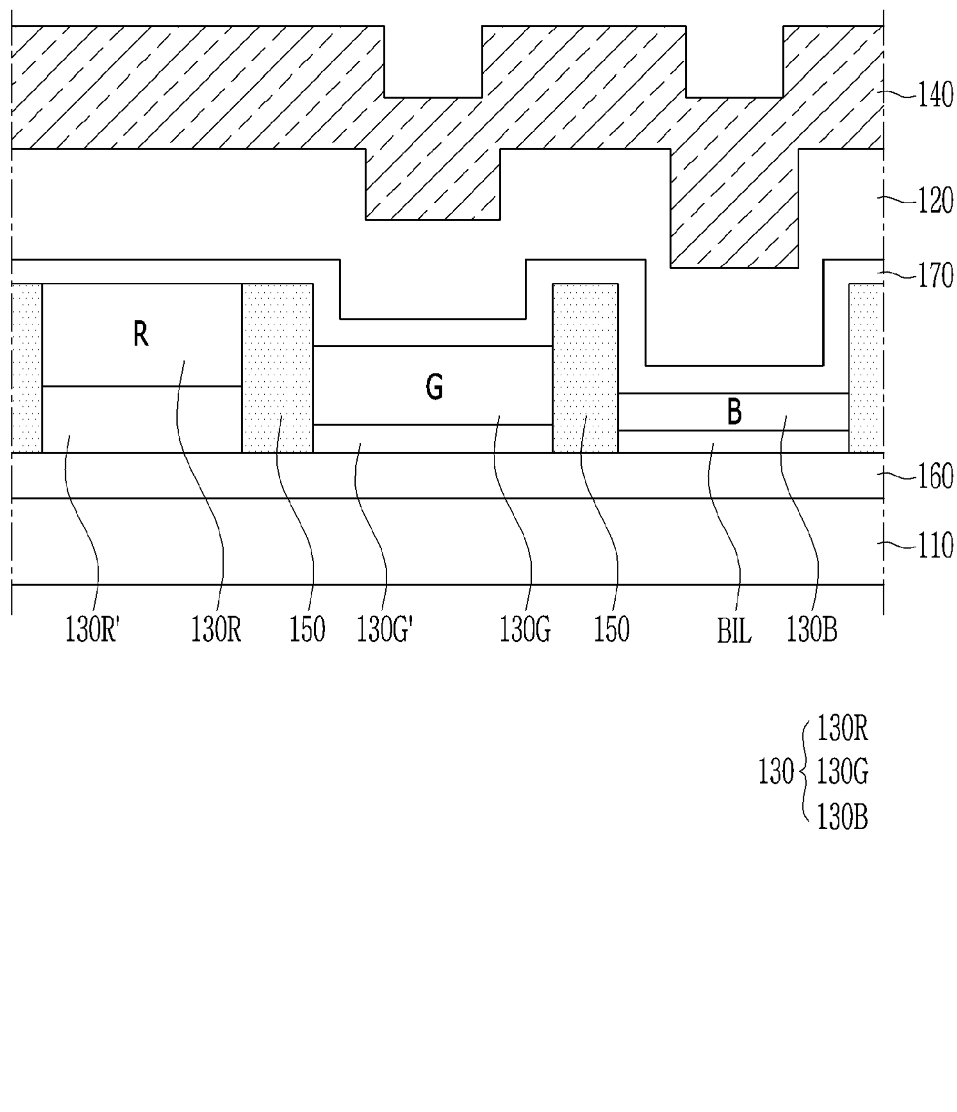
FIG. 1 illustrates a schematic structure of a light emitting diode according to an exemplary embodiment of the present disclosure.

Exemplary embodiments of the present disclosure will be described in detail with reference to the accompanying drawings. In describing the present disclosure, a description of known functions or configurations will be omitted so as to make the subject matter of the present disclosure clearer.

To clearly describe the present disclosure, portions which do not relate to the description are omitted, and like reference numerals designate like elements throughout the specification. The size and thickness of each component shown in the drawings are arbitrarily shown for better understanding and ease of description, but the present disclosure is not limited thereto.

In the drawings, the thicknesses of layers, films, panels, regions, etc., are exaggerated for clarity. For better understanding and ease of description, the thicknesses of some layers and areas are exaggerated. It will be understood that when an element such as a layer, film, region, or substrate is referred to as being "on" another element, it can be directly on the other element or intervening elements may also be present.

FIG. 1 illustrates a schematic structure of a light emitting diode according to an exemplary embodiment of the present disclosure. As shown in FIG. 1, a light emitting diode according to the present exemplary embodiment includes a first electrode 110, a second electrode 120, an emission layer 130, and a light efficiency improving layer 140.

The first electrode 110 may be positioned on a substrate to serve as an anode for operating the light emitting layer 130. However, the first electrode 110 is not limited thereto, and when the second electrode 120 serves as an anode, the first electrode 110 may serve as a cathode.

The light emitting diode according to the present exemplary embodiment may be a top emission type of light emitting diode. Accordingly, the first electrode 110 may serve as a reflection layer so that light emitted from the emission layer 130 is not emitted through a bottom surface. Herein, the reflection layer means a layer having a characteristic of reflecting light so that the light emitted from the emission layer 130 is emitted through the second electrode 120 to the outside. The characteristic of reflecting the light may mean that reflectance with respect to incident light is in a range of about 70% to about 100% or of about 80% to about 100%.

The first electrode 110 according to the present exemplary embodiment, so that it may serve as an anode and may be used as a reflection layer, may include silver (Ag), aluminum (Al), chromium (Cr), molybdenum (Mo), tungsten (W), titanium (Ti), gold (Au), palladium (Pd), or alloys thereof, and may have a triple layer structure of silver (Ag)/indium tin oxide (ITO)/silver (Ag) or indium tin oxide (ITO)/silver (Ag)/indium tin oxide (ITO).

The second electrode 120 overlaps the first electrode 110 with the emission layer 130 interposed between the second electrode 120 and the first electrode 110 as described later. The second electrode 120 according to the present exemplary embodiment may serve as a cathode. However, the second electrode 120 is not limited thereto, and when the first electrode 110 serves as a cathode, the second electrode 120 may serve as an anode.

The second electrode 120 according to the present exemplary embodiment may be a transflective electrode so that the light emitted from the emission layer 130 may be emitted to the outside. Herein, the transflective electrode means an electrode having a transflective characteristic of transmitting a portion of light incident on the second electrode 120 and of reflecting a portion of the remaining light to the first electrode 110. Herein, the transflective characteristic may mean that reflectance with respect to incident light is in a range of about 0.1% to about 70% or of about 30% to about 50%.

The second electrode 120 according to the present exemplary embodiment may include an oxide such as ITO or IZO, or silver (Ag), magnesium (Mg), aluminum (Al), chromium (Cr), molybdenum (Mo), tungsten (W), titanium (Ti), gold (Au), palladium (Pd), or an alloy thereof to have the transflective characteristic and simultaneously to have electrical conductivity.

The second electrode 120 of the present exemplary embodiment may have a high enough light transmittance so that the light emitted from the emission layer 130 may be smoothly emitted to the outside. Particularly, light of a blue series may be smoothly emitted to the outside, with light transmittance of about 20% or more with respect to light of a 430 nm to 500 nm wavelength. The 20% light transmittance is minimum for the light emitting diode according to the present exemplary embodiment to smoothly display a color, and it is preferable to be closer to 100%.

In the emission layer 130, holes and electrons respectively transmitted from the first electrode 110 and the second electrode 120 meet, thereby forming excitons to emit light. Therefore, the emission layer 130 according to the present exemplary embodiment is disposed between the first electrode 110 and the second electrode 120. In this case, a surface of the first electrode 110 disposed adjacent to the emission layer 130 is defined as one surface of the first electrode 110, and similarly, a surface of the second electrode 120 disposed adjacent to the emission layer 130 is defined as one surface of the second electrode 120. Therefore, the emission layer 130 is positioned between one surface of the first electrode 110 and one surface of the second electrode 120.

In FIG. 1, the emission layer 130 includes a blue emission layer 130B, and may further include a red emission layer 130R and a green emission layer 130G, or may have a single layer structure in which the blue emission layer 130B, the red emission layer 130R, and the green emission layer 130G are respectively disposed on the first electrode 110. Alternatively, although not shown, respective emission layers 130 include quantum dots having different sizes, so that they may display different colors by converting a wavelength of light into light having different wavelengths.

Blue, red, and green are three primary colors for displaying images, and combinations thereof may display various colors. The blue emission layer 130B, the red emission layer 130R, and the green emission layer 130G respectively form a blue pixel, a red pixel, and a green pixel, and the blue emission layer 130B, the red emission layer 130R, and the green emission layer 130G may be disposed on a plane that is substantially parallel to an upper surface of the first electrode 110.

A hole-transporting layer 160 may be further included between the first electrode 110 and the emission layer 130. The hole-transporting layer 160 may include at least one of a hole injection layer and a hole-transporting layer. The hole-injection layer performs a function of facilitating injection of holes from the first electrode 110, and the hole-transporting layer performs a function of smoothly transporting holes transmitted from the hole-injection layer. The hole-transporting layer 160 may be formed as a dual layer in which the hole-transporting layer is positioned on the hole-injection layer, or may be formed as a single layer in which a material of the hole-injection layer and a material of the hole-transporting layer are mixed.

An electron-transporting layer 170 may be further included between the second electrode 120 and the emission layer 130. The electron-transporting layer 170 may include at least one of an electron-injection layer and an electron-transporting layer. The electron-injection layer performs a function of facilitating injection of electrons from the second electrode 120, and the electron-transporting layer performs a function of smoothly transporting electrons transmitted from the electron-injection layer. The electron-transporting layer 170 may be formed as a dual layer in which the electron-transporting layer is positioned on the electron-injection layer, or may be formed as a single layer in which a material of the electron injection layer and a material of the electron transport layer are mixed.

However, the present disclosure is not limited thereto, and a light emitting diode according to an exemplary variation may include the emission layer 130 having a multi-layered structure. This will be described with reference to FIG. 2.

Figure 2:
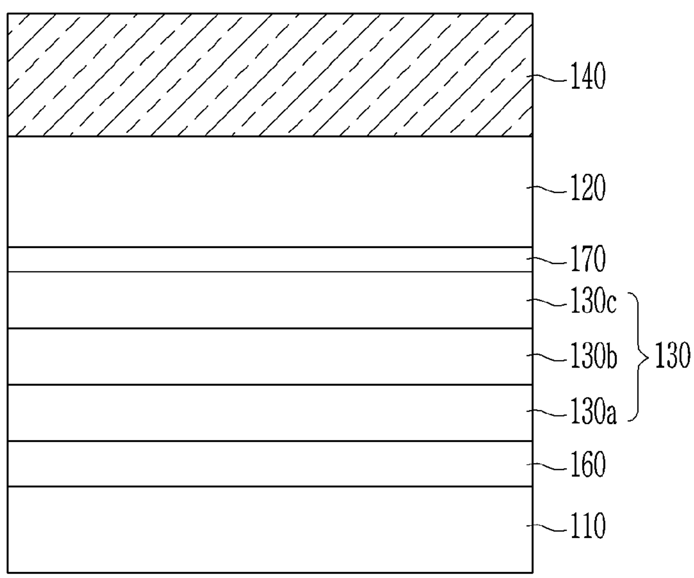
FIG. 2 illustrates a schematic structure of a light emitting diode according to another exemplary embodiment of the present disclosure.

FIG. 2 schematically illustrates a light emitting diode including the emission layer 130 having a multi-layered structure according to another exemplary embodiment of the present disclosure.

In the exemplary embodiment shown in FIG. 2, elements except for the emission layer 130 are similar to those of the light emitting diode according to the exemplary embodiment described with reference to FIG. 1. Therefore, the first electrode 110 and the second electrode 120 are disposed to overlap each other, and the emission layer 130 is disposed between the first electrode 110 and the second electrode 120. In this case, the light efficiency improving layer 140 is positioned on the other surface of the second electrode 120 facing one surface of the second electrode 120.

In FIG. 2, as an example of the top emission type of light emitting diode described above, it is illustrated that the light efficiency improving layer 140 is positioned only on the other surface of the second electrode 120 away from the first electrode 110 forming the reflection layer, but the present disclosure is not limited thereto. According to the present exemplary embodiment, in a case of the bottom emission type of light emitting diode, the light efficiency improving layer 140 may be positioned only on the other face of the first electrode 110 facing one surface of the first electrode 110, and in a case of a both emission type of light emitting diode, the light efficiency improving layer 140 may be positioned on both the other surface of the first electrode 110 and the other surface of the second electrode 120, as an exemplary variation.

In this case, the emission layer 130 according to the present exemplary embodiment is formed by stacking a plurality of layers 130*a*, 130*b*, and 130*c*. Respective layers 130*a*, 130*b*, and 130*c* included in the emission layer 130 represent different colors, and white light may be emitted by a combination thereof.

As shown in FIG. 2, the emission layer 130 according to the present exemplary embodiment may have a three-layered structure in which three layers 130*a*, 130*b*, and 130*c* are stacked, but is not limited thereto, and may have a two-layered structure.

As an example, the emission layer 130 having the three-layered structure may include a blue emission layer 130*a*, a red emission layer 130*b*, and a green emission layer 130*c*. However, the present disclosure is not limited thereto, and any emission layer capable of emitting white light by color combination may be included in the scope of the present disclosure.

In addition, although not shown, in the case of the emission layer having the two-layered structure, each layer may include a blue emission layer and a yellow emission layer.

Further, although not shown, a charge generation layer may be positioned between adjacent layers among the plurality of layers 130*a*, 130*b*, and 130*c* of FIG. 2.

In the display device using the light emitting diode according to the present exemplary embodiment, to convert the emitted white light into the other colors, a color filter layer disposed on the second electrode 120 may be further included.

For example, the color filter layer may convert white light passing through the second electrode 120 into blue, red, or green light, and for this, a plurality of sub-color filter layers respectively corresponding to a plurality of sub-pixels of the light emitting diode may be included.

Since the color filter layer is for converting the color of the light passing through the second electrode 120, various position designs may be possible if the color filter layer is only disposed on the second electrode 120.

Therefore, the color filter layer may be disposed on or under an encapsulation layer that is formed to protect the display device from external moisture or oxygen, and various disposition structures of the color filter layer are possible, thus the scope of the present exemplary embodiment may be applied to the various disposition structures.

The light emitting diode according to the exemplary embodiment shown in FIG. 2 is the same as the exemplary embodiment shown in FIG. 1 except for emitting the white light by the emission layer 130 including the plurality of layers 130*a*, 130*b*, and 130*c*. Therefore, the following will be described with reference to the light emitting diode shown in FIG. 1. The following description for the light emitting diode may be equally applied to the exemplary embodiment shown in FIG. 2.

A blue emission material included in the blue emission layer 130B according to the present exemplary embodiment has a range of a peak wavelength of about 430 nm to 500 nm in a photoluminescence (PL) spectrum.

As shown in FIG. 1, an auxiliary layer BIL for increasing efficiency of the blue emission layer 130B may be positioned under the blue emission layer 130B. The auxiliary layer BIL may serve to increase the efficiency of the blue emission layer 130B by controlling a hole-charge balance.

Similarly, as shown in FIG. 1, a red resonant auxiliary layer 130R' and a green resonant auxiliary layer 130G' may be respectively positioned under the red emission layer 130R and the green emission layer 130G. The red resonant auxiliary layer 130R' and the green resonant auxiliary layer 130G' are added in order to match a resonance distance for each color. Alternatively, the separate resonant auxiliary layer may not be formed under the blue emission layer 130B and the auxiliary layer BIL.

A pixel defining layer 150 may be positioned on the first electrode 110. The pixel defining layer 150, as shown in FIG. 1, is respectively positioned between the blue emission layer 130B, the red emission layer 130R, and the green emission layer 130G, thereby dividing the emission layers for each color.

The light efficiency improving layer 140 is positioned on the other surface of the second electrode 120 to control a length of a light path of the element, thereby adjusting an optical interference distance. In this case, the light efficiency improving layer 140 according to the present exemplary embodiment, differently from the auxiliary layer BIL, the red resonant auxiliary layer 130R', and the green resonant auxiliary layer 130G', may be commonly provided in each of the blue pixel, the red pixel, and the green pixel, as shown in FIG. 1.

The emission layer 130 according to the present exemplary embodiment, particularly, when being exposed to light such as sunlight, is degraded by wavelengths in the vicinity of 400 nm to 410 nm such that performance of the light emitting diode may deteriorate. Accordingly, a wavelength range of 400 nm to 410 nm corresponding to the wavelength range of the light degrading the light emitting diode will be described as a harmful wavelength range.

The light efficiency improving layer 140 according to the present exemplary embodiment includes a material that may block light in the range of 400 nm to 410 nm corresponding to the harmful wavelength range among light incident to the emission layer 130 to prevent the degradation of the emission layer 130 included in the light emitting diode.

Hereinafter, with reference to a first exemplary embodiment to a fifth exemplary embodiment of the present disclosure, a material included in the light efficiency improving layer 140 so that the light of the harmful wavelength range of 400 nm to 410 nm may be blocked will be described in detail.

According to the present exemplary embodiment, the light efficiency improving layer 140 may include a material having a structure of Chemical Formula 1 below.

[Chemical Formula 1]

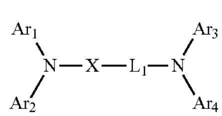

In this case, X has a structure of C1-Z—C2 in which C1 and C2 are each independently selected from benzene, naphthalene, and anthracene; Z is one of $CH_2$, CHR, CR1R2, O, and S; R, R1, and R2 are each independently a substituted or unsubstituted alkyl group having 1 to 5 carbon atoms; C1-Z—C2 consists of one condensed ring having 4 or 5 carbon atoms; L1 is a substituted or unsubstituted arylene group having 5 to 8 carbon atoms, or a substituted or unsubstituted heteroarylene group having 4 to 8 carbon atoms as an independent single bond and a divalent linking group; and Ar1 to Ar4 each independently represent a substituted or unsubstituted arylene group having 6 to 30 carbon atoms, a substituted or unsubstituted heteroarylene group having 3 to 30 carbon atoms, or a substituted or unsubstituted condensed polycyclic group having 6 to 30 carbon atoms.

Here, the term "unsubstituted" means that all atoms positioned at substitution positions included in each functional group are hydrogen; and the term "substituted" means that at least one of atoms positioned at substitution positions included in each functional group, instead of hydrogen, is substituted by other atoms such as deuterium, —F, —Cl, —Br, —I, a hydroxyl group, a cyano group, a nitro group, an amino group, an amidino group, a hydrazine group, a hydrazone group, a carboxylic acid or a salt thereof a sulfonic acid or a salt thereof a phosphoric acid or a salt thereof, or a substituent.

On the other hand, the "substituent" includes a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, which are defined as described above.

Specifically, according to a first exemplary embodiment to a third exemplary embodiment of the present disclosure, X of Chemical Formula 1 may have a structure of Chemical Formula 2 to Chemical Formula 4 below. As described in detail later, in the first exemplary embodiment of the present disclosure, Z of Chemical Formula 2 to Chemical Formula 4 is $C(CH_3)_2$, in the second exemplary embodiment, Z of Chemical Formula 2 to Chemical Formula 4 is O, and in the third exemplary embodiment, Z of Chemical Formula 2 to Chemical Formula 4 is S. In this case, * and *' indicate a site that is bound to a neighboring atom.

[Chemical Formula 2]

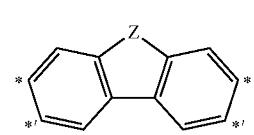

-continued

[Chemical Formula 3]

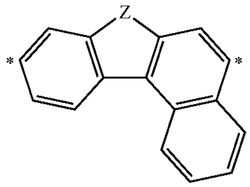

[Chemical Formula 4]

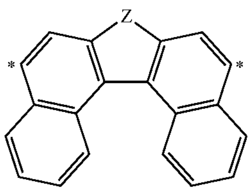

In this case, Z is one of $CH_2$, CHR, CR1R2, O, and S; R, R1, and R2 are the same or different substituted or unsubstituted alkyl group having 1 to 5 carbon atoms; and * and *' indicate a site that is bound to a neighboring atom.

Hereinafter, the first exemplary embodiment to the third exemplary embodiment of the present disclosure will be described in detail.

When, in the first exemplary embodiment of the present disclosure, Z is $C(CH_3)_2$, the light efficiency improving layer 140 according to the first exemplary embodiment includes one of Compound A1 to Compound A5 below.

[Compound A1]

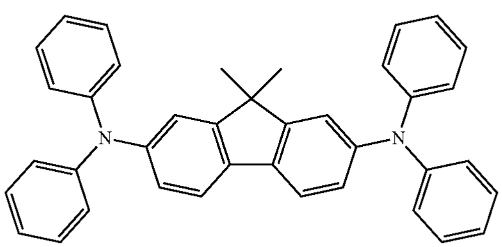

[Compound A2]

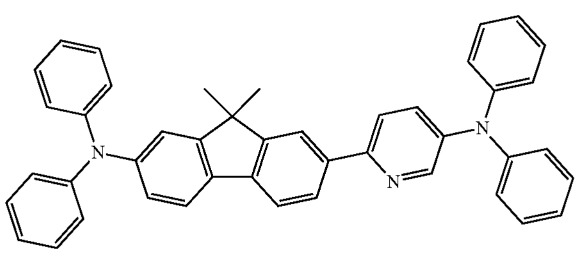

[Compound A3]

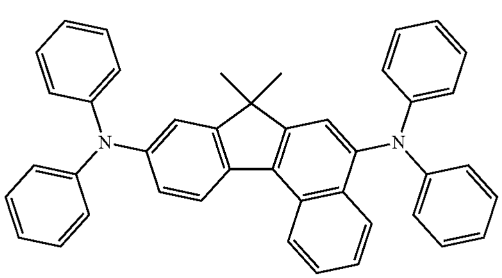

-continued

[Compound A4]

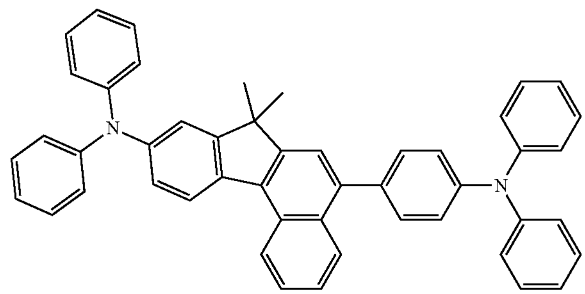

[Compound A5]

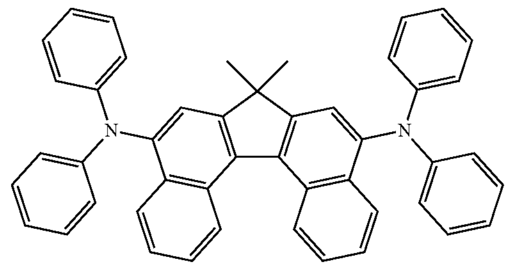

When, in the second exemplary embodiment of the present disclosure, Z is O, the light efficiency improving layer 140 according to the second exemplary embodiment includes one of Compound A6 to Compound A10 below.

[Compound A6]

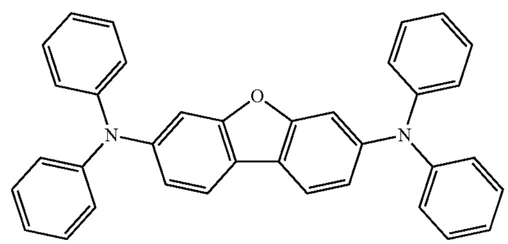

[Compound A7]

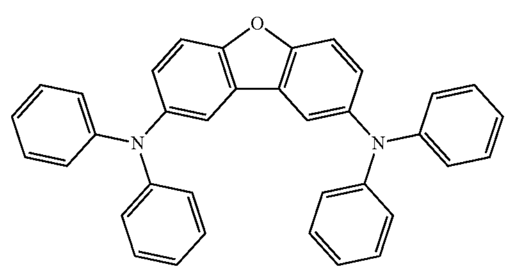

[Compound 8]

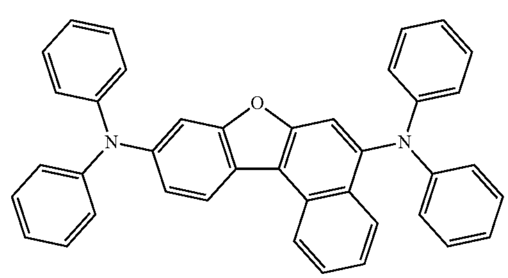

-continued

[Compound A9]

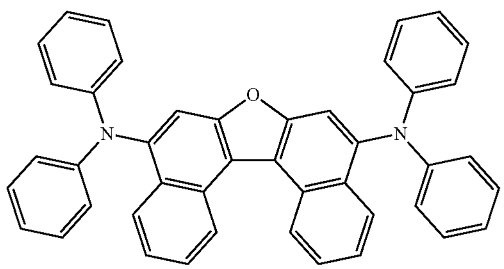

[Compound A10]

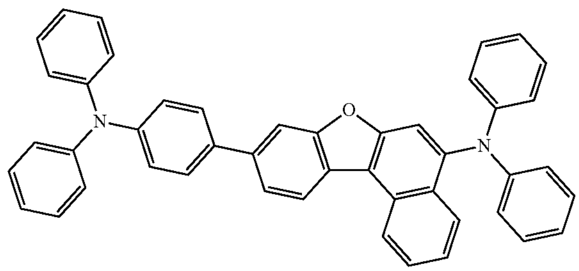

When, in the third exemplary embodiment of the present disclosure, Z is S, the light efficiency improving layer 140 according to the third exemplary embodiment includes one of Compound A11 to Compound A15 below.

[Compound A11]

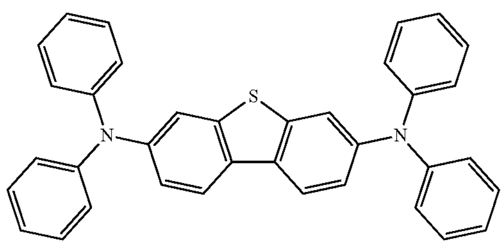

[Compound A12]

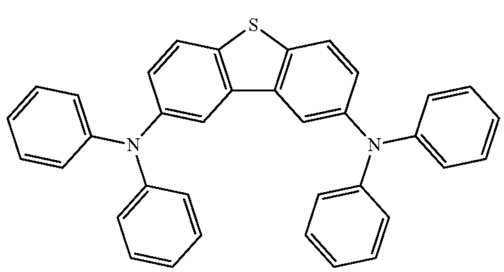

[Compound A13]

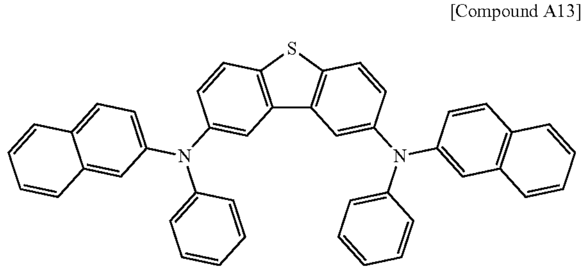

-continued

[Compound A14]

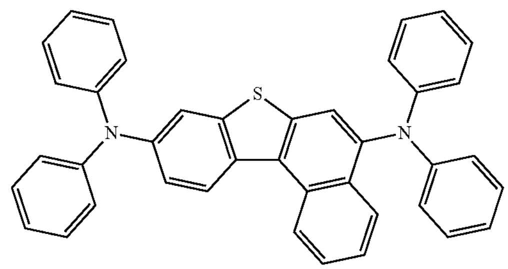

[Compound A15]

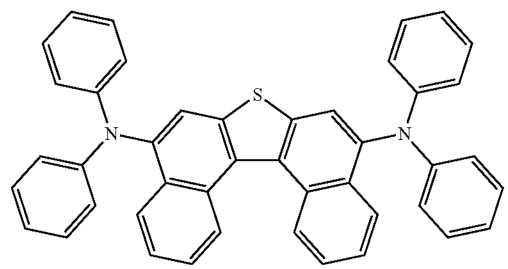

Hereinafter, according to the fourth exemplary embodiment and the fifth exemplary embodiment of the present disclosure, a case in which X of Chemical Formula 1 has a structure other than Chemical Formula 2 to Chemical Formula 4 will be further described.

According to the fourth exemplary embodiment of the present disclosure, X of Chemical Formula 1 may have a structure of Chemical Formula 5, and in this case, * indicates a site that is bound to a neighboring atom.

[Chemical Formula 5]

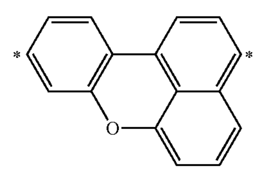

In this case, the light efficiency improving layer 140 according to the fourth exemplary embodiment includes one of Compound A16 to Compound A18.

[Compound A16]

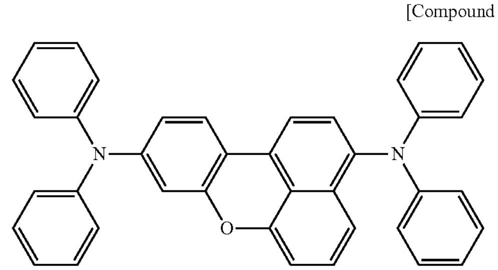

-continued

[Compound A17]

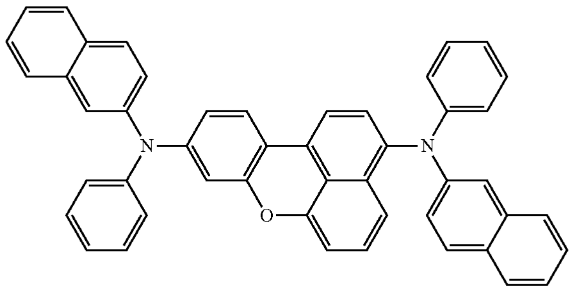

[Compound A18]

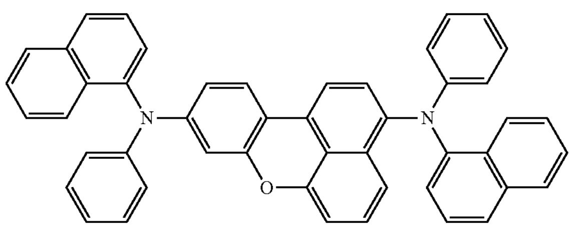

According to the fifth exemplary embodiment of the present disclosure, X of Chemical Formula 1 may have a structure of Chemical Formula 6, and in this case, * indicates a site that is bound to a neighboring atom.

[Chemical Formula 6]

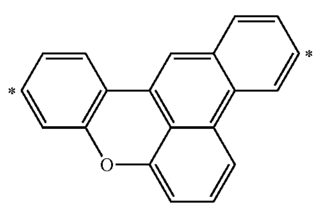

In this case, the light efficiency improving layer 140 according to the fifth exemplary embodiment includes one of Compound A19 and Compound A20.

[Compound A19]

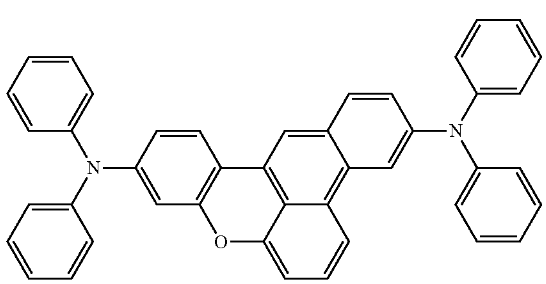

-continued

[Compound A20]

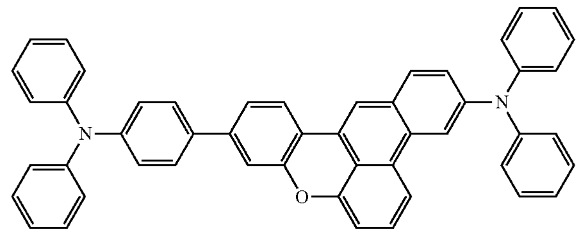

The specific materials included in the light efficiency improving layer 140 that may block light of 400 nm to 410 nm corresponding to the harmful wavelength range according to the first exemplary embodiment to the fifth exemplary embodiment of the present disclosure have been described. Table 1 shows results of measuring driving voltages, current density, luminance, efficiency, and half lifespan with respect to the light emitting diodes (Experimental Examples 1 to 4) provided with the light efficiency improving layer 140 including one material for each exemplary embodiment among Compound A1 to Compound A20 according to the first exemplary embodiment to the fifth exemplary embodiment of the present disclosure, and a light emitting diode provided with a light efficiency improving layer according to a comparative example. The light emitting diodes according to Experimental Examples 1 to 4 and the comparative example of which the emission layer 130 was made of an organic material was tested.

EXPERIMENTAL EXAMPLE 1

An anode was prepared by cutting a Corning 15 $\Omega/cm^2$ 1200 Å ITO glass substrate into a size of 50 mm×50 mm×0.7 mm, ultrasonic cleaning for 5 minutes using each of isopropyl alcohol and pure water, irradiating it with ultraviolet rays for 30 minutes, and cleaning it by exposing it to ozone, and then the glass substrate was placed on a vacuum vapor deposition apparatus.

2-TNATA was vacuum-deposited as a hole-transporting layer on an upper portion of the substrate to have a 1000 Å thickness.

9,10-di-naphthalene-2-yl-anthracene (hereinafter referred to as ADN) corresponding to a known blue fluorescent host and N,N,N',N'-tetraphenyl-pyrene-1,6-diamine (TPD) corresponding to a known compound as a blue fluorescent dopant were simultaneously subjected to vacuum deposition in a weight ratio of 98:2 to form an emission layer having a thickness of 300 Å on the upper portion of the hole-transporting layer.

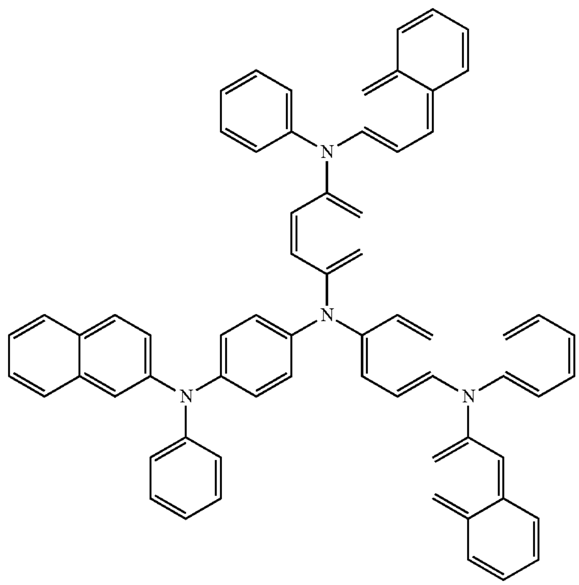

2-TNA TA

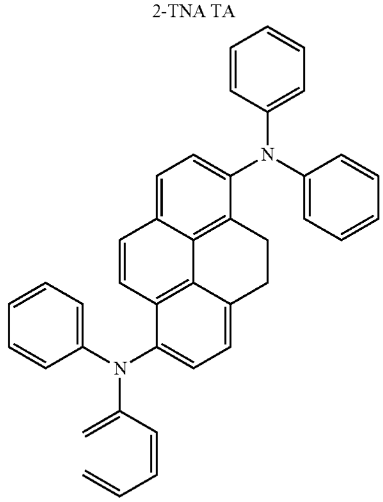

TPD

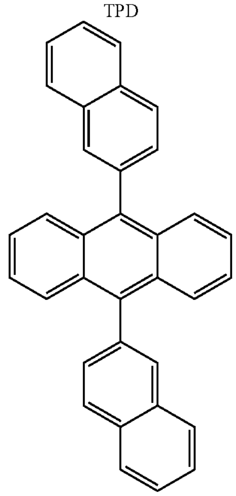

ADN

Subsequently, Alq3 as an electron-transporting layer was deposited on an upper portion of the emission layer to a thickness of 300 Å, LiF as a halogenated alkali metal was deposited on an upper portion of the electron transport layer to a thickness of 10 Å, and then Al as a transmissive electrode was vacuum-deposited on the LiF as the halogenated alkali metal to a thickness of 100 Å to form a LiF/Al electrode (negative electrode). A compound represented as Compound A3 corresponding to the light efficiency improving layer was deposited thereon to a thickness of 800 Å to prepare an organic light emitting diode.

EXPERIMENTAL EXAMPLE 2

An organic light emitting device was prepared in the same manner as in Experimental Example 1, except that Compound A8 instead of Compound A3 was used in the light efficiency improving layer.

EXPERIMENTAL EXAMPLE 3

An organic light emitting device was prepared in the same manner as in Experimental Example 1, except that Compound A12 instead of Compound A3 was used in the light efficiency improving layer.

EXPERIMENTAL EXAMPLE 4

An organic light emitting device was prepared in the same manner as in Experimental Example 1, except that Compound A13 instead of Compound A3 was used in the light efficiency improving layer.

EXPERIMENTAL EXAMPLE 5

An organic light emitting device was prepared in the same manner as in Experimental Example 1, except that Compound A16 instead of Compound A3 was used in the light efficiency improving layer.

EXPERIMENTAL EXAMPLE 6

An organic light emitting device was prepared in the same manner as in Experimental Example 1, except that Compound A18 instead of Compound A3 was used in the light efficiency improving layer.

EXPERIMENTAL EXAMPLE 7

An organic light emitting device was prepared in the same manner as in Experimental Example 1, except that Compound A20 instead of Compound A3 was used in the light efficiency improving layer.

COMPARATIVE EXAMPLE 1

An organic light emitting device was prepared in the same manner as in Experimental Example 1, except that a compound N,N'-Di(1-naphthyl)-N,N'-diphenyl-(1,1'-biphenyl)-4,4'-diamine (NPB) instead of Compound A3 was used in the light efficiency improving layer.

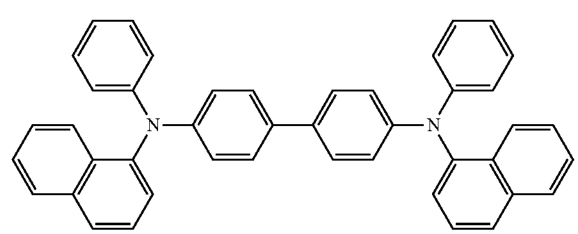

NPB

The results of Experimental Examples 1 to 7 and the comparative example described above are summarized and shown in Table 1.

TABLE 1

| | Light efficiency improving layer material | Driving voltage (V) | Current density ($mA/cm^2$) | Luminance ($cd/m^2$) | Efficiency (cd/A) | Half life-span (h @100 $mA/cm^2$) |
|---|---|---|---|---|---|---|
| Experimental Example 1 | Compound A3 (first exemplary embodiment) | 5.92 | 50 | 2360 | 4.72 | 260 |
| Experimental Example 2 | Compound A8 (second exemplary embodiment) | 5.88 | 50 | 2345 | 4.69 | 270 |
| Experimental Example 3 | Compound A12 (third exemplary embodiment) | 5.90 | 50 | 2350 | 4.70 | 262 |
| Experimental Example 4 | Compound A13 (third exemplary embodiment) | 5.84 | 50 | 2390 | 4.78 | 272 |
| Experimental Example 5 | Compound A16 (fourth exemplary embodiment) | 5.76 | 50 | 2490 | 4.98 | 265 |
| Experimental Example 6 | Compound A18 (fourth exemplary embodiment) | 5.94 | 50 | 2440 | 4.88 | 272 |
| Experimental Example 7 | Compound A20 (fifth exemplary embodiment) | 5.92 | 50 | 2410 | 4.82 | 260 |
| Comparative example | NPB | 5.90 | 50 | 2160 | 4.32 | 250 |

As shown in Table 1, compared to the light efficiency improving layer according to the comparative example, it can be seen that all of the luminance, the efficiency, and the half lifespan of the light efficiency improving layers 140 according to the first to seventh experimental examples of the present disclosure were increased at the same current density and a similar driving voltage range.

As described above, the light emitting diodes including the light efficiency improving layers 140 according to various embodiments of the present disclosure have been described. According to the present disclosure, it is possible to provide a light emitting diode capable of preventing the emission layer 130 from being damaged due to deterioration thereof by improving a blocking ratio of light having a wavelength of 400 nm to 410 nm corresponding to the harmful wavelength range.

Although the specific exemplary embodiments have been described and illustrated above, the present disclosure is not limited to the exemplary embodiments described herein, and it would be apparent to those skilled in the art that various changes and modifications might be made to these embodiments without departing from the spirit and the scope of the disclosure. Therefore, the changed examples and modified examples should not be individually understood from the technical spirit or the viewpoint of the present disclosure, and it should be appreciated that modified exemplary embodiments will be included in the appended claims of the present disclosure.

What is claimed is:

1. A light emitting diode comprising:

a first electrode;

a second electrode overlapping the first electrode;

an emission layer interposed between the first electrode and the second electrode; and a light efficiency improving layer positioned on at least one of the first electrode and the second electrode, wherein at least one of the first electrode and the second electrode includes:

one surface facing the emission layer and the other surface opposing the one surface and including the other surface on which the light efficiency improving layer is positioned, and wherein the light efficiency improving layer has a structure of Chemical Formula 1 below, wherein X has a structure of C1-Z—C2 in which C1 and C2 are each independently selected from benzene, naphthalene, and anthracene; Z is one of $CH_2$, CHR (in which R is a substituted or unsubstituted alkyl group having 1 to 5 carbon atoms), CR1R2 (in which each of R1 and R2 is an independently substituted or unsubstituted alkyl group having 1 to 5 carbon atoms), O, and S; C1-Z—C2 consists of one condensed ring having 4 or 5 carbon atoms but excluding a 6-membered heteroatomic ring wherein the heteroatom is O or S;

L1 is a substituted or unsubstituted arylene group having 5 to 8 carbon atoms, or a substituted or unsubstituted heteroarylene group having 4 to 8 carbon atoms as a single bond and a divalent linking group; and Ar1 to Ar4 each independently represent a substituted or unsubstituted arylene group having 6 to 30 carbon atoms, a substituted or unsubstituted heteroarylene group having 3 to 30 carbon atoms, or a substituted or unsubstituted condensed polycyclic group having 6 to 30 carbon atoms:

[Chemical Formula 1]

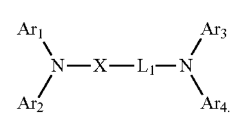

2. The light emitting diode of claim 1, wherein

X has a structure of one of Chemical Formula 2 to Chemical Formula 4,

Z is one of $CH_2$, CHR, CR1R2, O, and S, and

R, R1, and R2 are each independently a substituted or unsubstituted alkyl group having 1 to 5 carbon atoms, and X does not have a structure of Chemical Formula 2 wherein Z is CR1R2, wherein * and *' indicate a site that is bound to a neighboring atom:

[Chemical Formula 2]

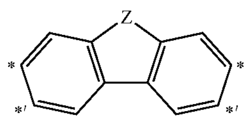

[Chemical Formula 3]

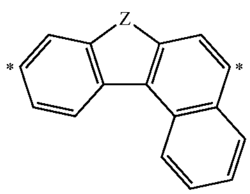

[Chemical Formula 4]

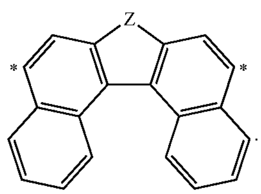

3. The light emitting diode of claim 2, wherein

Z is $(CH_3)_2$.

4. The light emitting diode of claim 3, wherein the light efficiency improving layer includes one of Compound A3 to Compound A5:

[Compound A3]

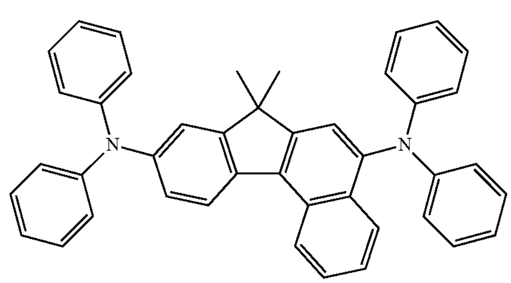

[Compound A4]

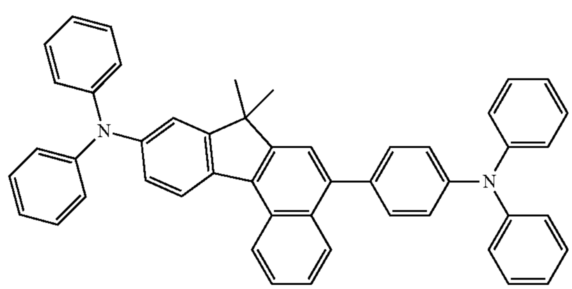

-continued

[Compound A5]

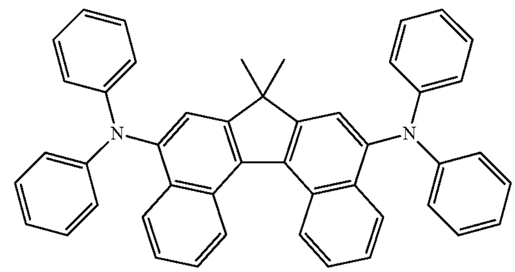

5. The light emitting diode of claim 2, wherein

Z is O, and the light efficiency improving layer includes one of Compound A6 to Compound A10:

[Compound A6]

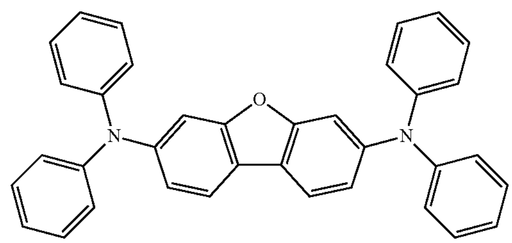

[Compound A7]

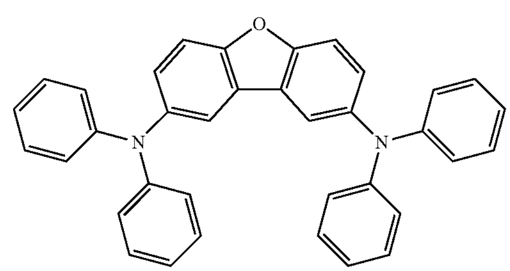

[Compound A8]

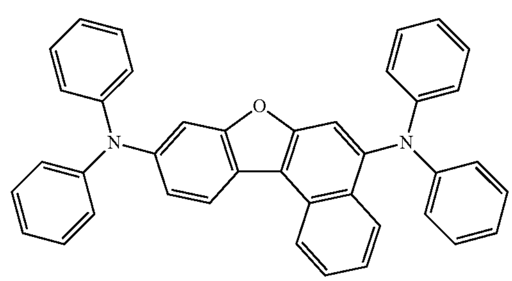

[Compound A9]

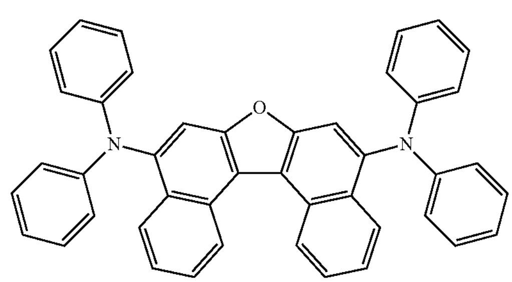

-continued

[Compound A10]

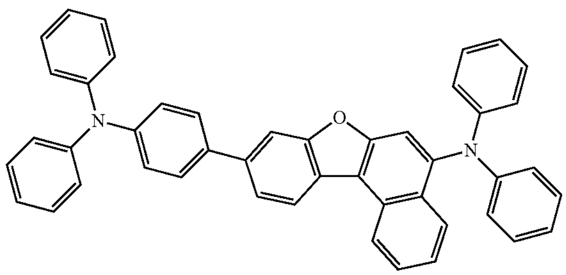

6. The light emitting diode of claim 2, wherein

Z is S, and the light efficiency improving layer includes one of Compound A11 to Compound A15:

[Compound A11]

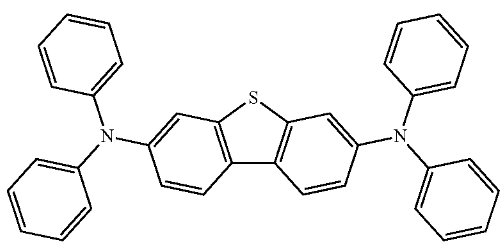

[Compound A12]

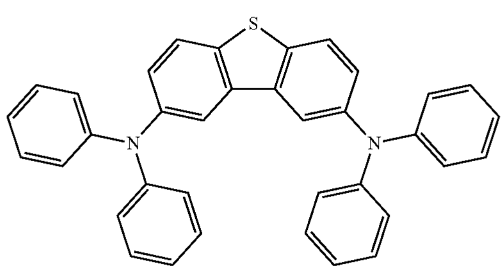

[Compound A13]

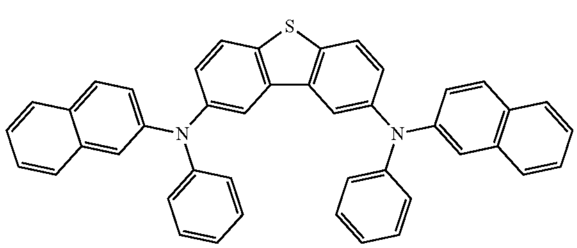

[Compound A14]

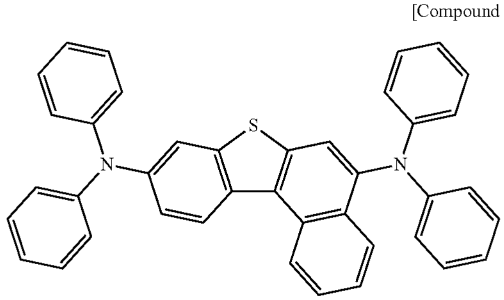

-continued

[Compound A15]

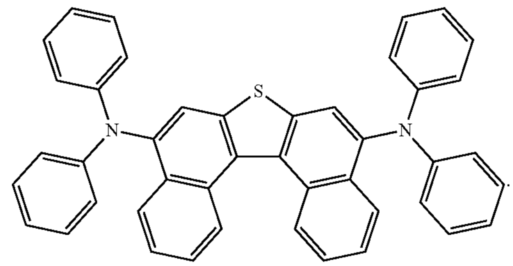

7. The light emitting diode of claim 1, wherein

X has a structure of Chemical Formula 5, and wherein * indicates a site that is bound to a neighboring atom:

[Chemical Formula 5]

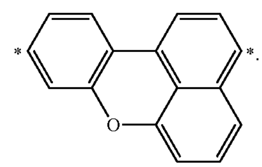

8. A light emitting diode comprising:

a first electrode;

a second electrode overlapping the first electrode;

an emission layer interposed between the first electrode and the second electrode; and a light efficiency improving layer positioned on at least one of the first electrode and the second electrode, wherein at least one of the first electrode and the second electrode includes:

one surface facing the emission layer and the other surface opposing the one surface and including the other surface on which the light efficiency improving layer is positioned, and wherein the light efficiency improving layer includes one of Compound A17 to Compound A18:

[Compound A17]

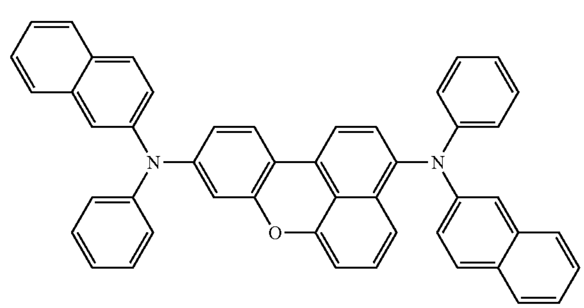

-continued

[Compound A18]

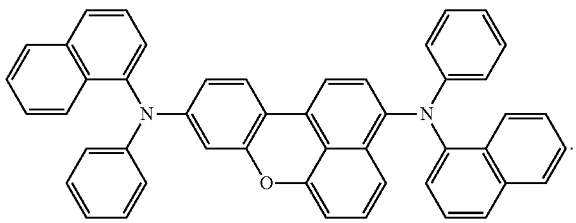

9. A light emitting diode comprising:
a first electrode;
a second electrode overlapping the first electrode;
an emission layer interposed between the first electrode and the second electrode; and
a light efficiency improving layer positioned on at least one of the first electrode and the second electrode,
wherein at least one of the first electrode and the second electrode includes:
one surface facing the emission layer and
the other surface opposing the one surface and including the other surface on which the light efficiency improving layer is positioned, and
wherein the light efficiency improving layer has a structure of Chemical Formula 1 below:
L1 is a substituted or unsubstituted arylene group having 5 to 8 carbon atoms, or a substituted or unsubstituted heteroarylene group having 4 to 8 carbon atoms as a single bond and a divalent linking group;
Ar1 to Ar4 each independently represent a substituted or unsubstituted arylene group having 6 to 30 carbon atoms, a substituted or unsubstituted heteroarylene group having 3 to 30 carbon atoms, or a substituted or unsubstituted condensed polycyclic group having 6 to 30 carbon atoms:
[Chemical Formula 1]

[Chemical Formula 1]

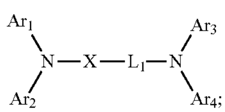

and
wherein X has a structure of Chemical Formula 6, and wherein * indicates a site that is bound to a neighboring atom:

[Chemical Formula 6]

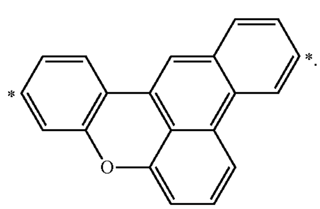

10. The light emitting diode of claim 9, wherein
the light efficiency improving layer includes one of Compound A19 and Compound A20:

[Compound A19]

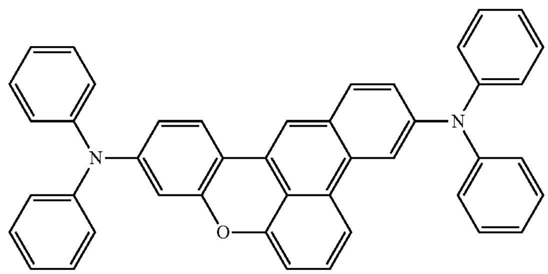

[Compound A20]

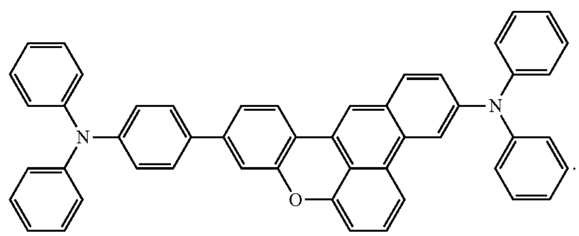

11. The light emitting diode of claim 1, wherein
the light efficiency improving layer has an absorption ratio of 0.30 or more at a wavelength of 400 nm to 410 nm.

12. The light emitting diode of claim 1, wherein
the emission layer is provided with a plurality of layers displaying different colors to emit white light.

13. The light emitting diode of claim 12, wherein
the plurality of layers has a structure in which two or three layers are stacked.

14. The light emitting diode of claim 8, wherein
the light efficiency improving layer has an absorption ratio of 0.30 or more at a wavelength of 400 nm to 410 nm.

15. The light emitting diode of claim 8, wherein
the emission layer is provided with a plurality of layers displaying different colors to emit white light.

16. The light emitting diode of claim 15, wherein
the plurality of layers has a structure in which two or three layers are stacked.

17. The light emitting diode of claim 9, wherein
the light efficiency improving layer has an absorption ratio of 0.30 or more at a wavelength of 400 nm to 410 nm.

18. The light emitting diode of claim 9, wherein
the emission layer is provided with a plurality of layers displaying different colors to emit white light.

19. The light emitting diode of claim 18, wherein
the plurality of layers has a structure in which two or three layers are stacked.

* * * * *